US006728029B2

United States Patent
Krummrich

(10) Patent No.: US 6,728,029 B2
(45) Date of Patent: Apr. 27, 2004

(54) RAMAN AMPLIFIER WITH A NUMBER OF PUMP SOURCES

(75) Inventor: Peter Krummrich, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/002,874

(22) Filed: Nov. 14, 2001

(65) Prior Publication Data

US 2002/0075561 A1 Jun. 20, 2002

(30) Foreign Application Priority Data

Nov. 14, 2000 (DE) .......................... 100 56 328

(51) Int. Cl.[7] ................................ H01S 3/00
(52) U.S. Cl. .................... 359/344; 359/341.3
(58) Field of Search ................ 359/334, 341.3

(56) References Cited

U.S. PATENT DOCUMENTS

| 5,530,936 | A | 6/1996 | Harasawa |
| 6,111,688 | A | 8/2000 | Kobayashi et al. |
| 6,292,288 | B1 * | 9/2001 | Akasaka et al. ............ 359/334 |
| 6,452,716 | B1 * | 9/2002 | Park et al. .................. 359/334 |
| 6,462,861 | B2 * | 10/2002 | Ohshima et al. ............ 359/334 |

FOREIGN PATENT DOCUMENTS

WO   WO 00/49721   8/2000

OTHER PUBLICATIONS

Electronics Letters, vol. 35, No. 16, 100nm bandwidth flat–gain Raman amplifiers pumped and gain–equalised by 12–wavelength channel WDM laser diode unit, Y. Emori, K. Tanaka, S. Namiki, Aug. 5, 1999, pp. 1355–1356.
Dynamic Gain and OutPut Power Control in a Gain–Flattened Erbium–Doped Fiber Amplifier, S.Y. Park, H.K. Kim, G.Y. Lyu, S.M. Kang and S.Y. Shin, 1998, pp. 787–789.

* cited by examiner

Primary Examiner—Mark Hellner
(74) Attorney, Agent, or Firm—Bell, Boyd & Lloyd LLC

(57) ABSTRACT

A Raman amplifier with a number of pump lasers whose pump signals are regulated. In order to improve the frequency stability, the pump lasers are followed by optical filters. Polarization mixers produce a constant gain for different polarizations of a WDM signal. Matching to different transmission conditions and to a different number of transmission bands can be carried out via a controller.

9 Claims, 2 Drawing Sheets

RAMAN AMPLIFIER WITH A NUMBER OF PUMP SOURCES

BACKGROUND OF THE INVENTION

It is known from "System Margin Enhancement with Raman Gain in Multi-Span WDM-Transmission", Srivastava et al., Technical Digest OFC '99 Friday, Feb. 26, 1999, for distributed Raman amplifiers to be used in order to improve the signal-to-noise ratio. In a Raman amplifier, at least one pump signal is preferably fed in in the opposite direction to the transmission direction, and amplifies the transmitted data signal on the basis of the Raman effect. Since broadband wavelength-division multiplexed signals are normally transmitted, a number of pump sources are provided in order to obtain a Raman gain profile which is as flat as possible, or some other desirable wavelength-dependent Raman gain profile. In previously used Raman pump sources, the pump power levels of the individual laser diodes are kept constant via constant injection currents. However, this type of control of the laser output power levels can lead to fluctuations due to temperature changes. Furthermore, aging of the laser diodes can lead to a decrease in the pump power level. Previous control systems using monitor diodes on the rear end face of the lasers are not sufficient to keep the pump power level sufficiently constant.

Furthermore, with the WDM transmission systems that are now in use, the level of individual signal elements in the WDM signal must not vary even when individual channels are connected or disconnected. In addition, the amplifiers must be matched to the characteristics of the path sections; in particular, to the fiber type. Furthermore, it should be possible to connect and disconnect transmission bands.

Further problems occur when a changing number of transmission bands are intended to be used. The transmission bands influence one another, owing to the Raman effect.

An object of the present invention is, therefore, to keep the pump power levels constant. Further object elements are to design the Raman amplifier for WDM signals (wavelength-division multiplexed signals) with different numbers of channels, and to allow matching to different transmission paths and operating conditions.

SUMMARY OF THE INVENTION

The Raman amplifier according to the present invention has the advantage that the pump power levels and pump wavelengths are constant. This is achieved by individual filtering and control of the individual pump sources. Polarization mixers (polarizers) ensure that the polarization is scrambled in order to achieve a gain level which is independent of the polarization of the WDM signal.

Since the Raman amplifier is used in WDM systems, the connection or disconnection of one or more transmission channels should not have any influence on the other channels. The Raman amplifier is, therefore, operated in the linear area.

A controller is advantageous which drives the pump lasers optimally for matching to different transmission sections and transmission characteristics.

Additional features and advantages of the present invention are described in, and will be apparent from, the following Detailed Description of the Invention and the Figures.

DETAILED DESCRIPTION OF THE INVENTION

Figure 1:
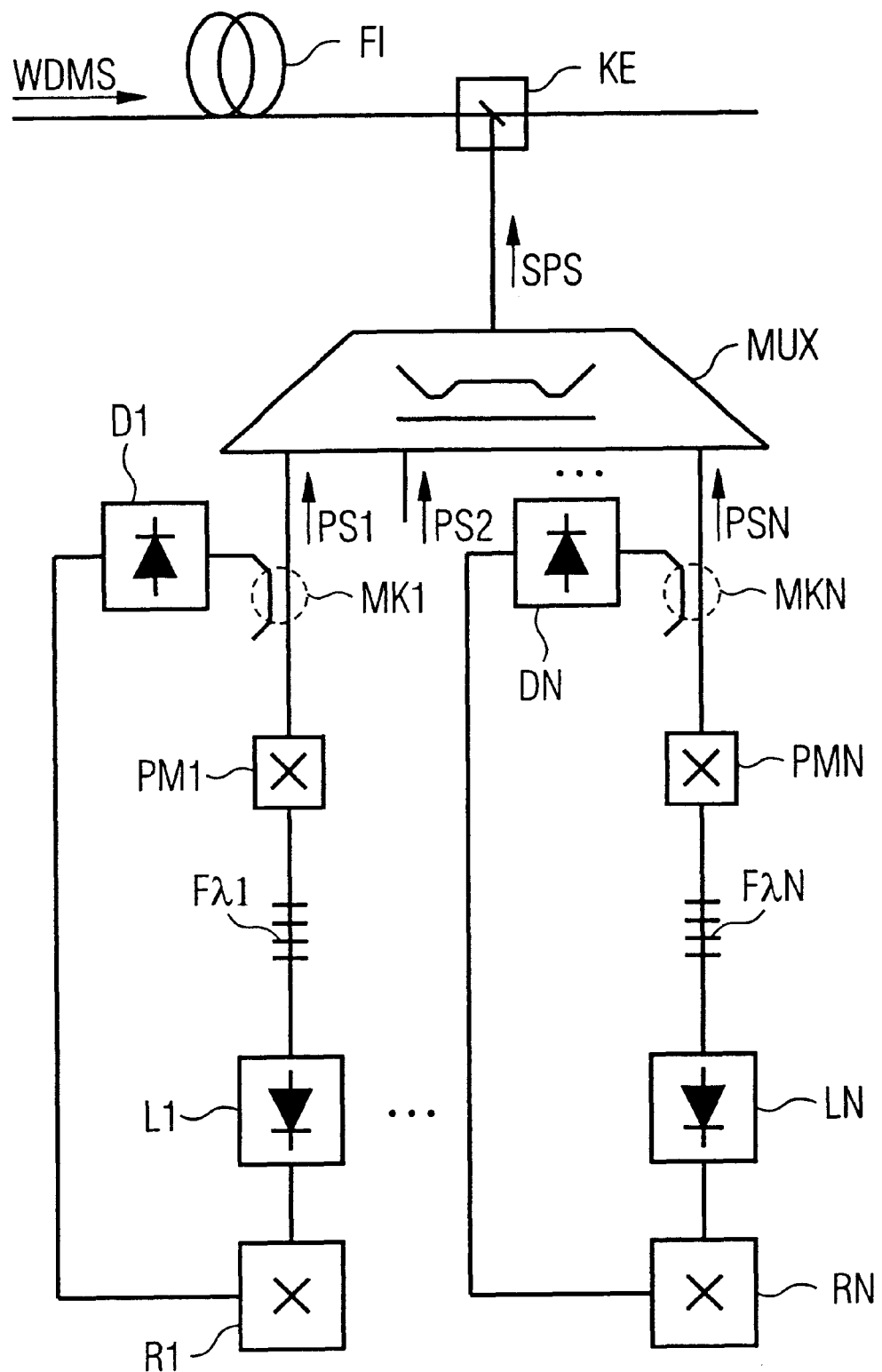
FIG. 1 shows a Raman amplifier of the present invention with controlled pump sources.

FIG. 1 shows an outline circuit diagram of a Raman amplifier according to the present invention with a number of pump sources which produce a total pump signal SPS which is fed into a transmission fiber FI via a coupling device KE (bandpass filter) in the opposite direction to the transmission direction of a wavelength division multiplexer signal WDMS. The total pump signal SPS is obtained by multiplexing a number of individual pump signals PS1–PSN in an optical multiplexer MUX. Pump lasers L1–LN are provided for producing these pump signals; each pump laser producing one pump signal. The frequencies of the pump lasers are stabilized via optical filters (fiber gratings) F$\lambda$1–F$\lambda$N, which each reflect a small portion of the signals. If the pump lasers are already at the desired frequencies and these frequencies are sufficiently stable (temperature fluctuations, aging, etc.), there is no need for the optical filters.

In order to be independent of the polarization of the transmitted wavelength-division multiplexed signal WDMS, each pump signal should pass through a polarization mixer PM1–PMN. This may be in the form of an active element; however, a passive configuration is preferable in which the pump signal is broken down into differently polarized components, which have different delays and are joined together again. The power levels (amplitudes) of the pump signals PS1–PSN obtained in this way are measured by, in each case, outputting a small proportion (for example 2%) of the pump signals via a measurement coupler MK1–MKN, and supplying this to a monitor diode D1–DN. The measurement signals MS1–MSN obtained in this way control the respectively associated pump lasers L1–LN via a respective regulator R1–RN, in order to keep the power levels of the pump signals constant.

The power levels and frequency separations of the pump lasers are chosen such that a Raman gain profile which is as flat as possible or a desired Raman gain profile is achieved in the relevant wavelength band. The pump power levels can be set on the basis of measurements of the signal power levels or on the basis of tables which have already been produced or calculated on the basis of reference measurements.

Figure 2:
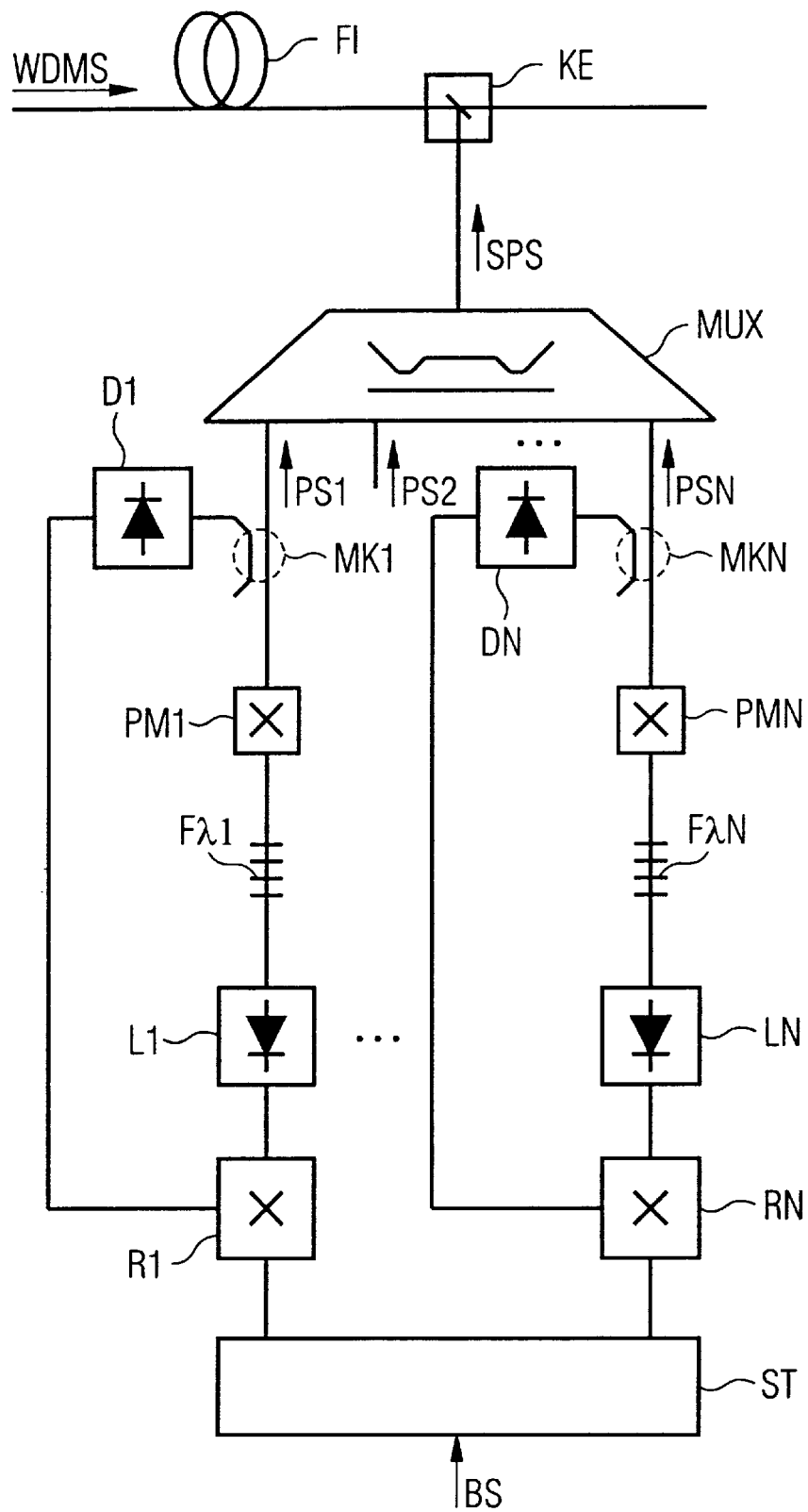
FIG. 2 shows a corresponding Raman amplifier arrangement with the addition of a controller.

In FIG. 2, a controller ST has been added to the arrangement described above. This controller allows the power level of the individual pump signals to be varied by changing the reference variables for the regulators. The pump power levels required for a flat gain spectrum (or level profile) depend on the type of transmission fiber. An optimum gain spectrum can thus be set on initial use by measuring the gain spectrum (or the levels) and setting the output power levels of the pump lasers. Alternatively, on initial use of a transmission path, the fiber type and, possibly, further system data, for example the required Raman gain, can be reported to the controller. The required output power levels of the pump lasers are set by varying the reference variables via a stored table. This data is, for example, determined in the laboratory for different fiber types and is then either stored in a table in the controller or supplied externally to it. The two methods also may be combined by using measurements for optimization after carrying out a setting process based on the table.

On initial use of a path, all the pump lasers required for a flat gain spectrum are switched on.

A transmission band which has not yet been used also can be taken into account in this process.

If a transmission band is connected and this capability has not yet been taken into account for the setting of the pump lasers, since only some of the pump lasers were activated for a transmission band, then the power levels of the pump lasers must be reset. In the exemplary embodiment shown in FIG. 1, this can be done only by individual readjustment of the pump power levels (no adjustment capability for the respective reference variable is shown). As shown in FIG. 2, this adjustment process can be initiated by an external busy signal BS, with the settings being made on the basis of the table stored in the controller. Since the Raman amplifier is operated in the linear area, individual channels can be connected or disconnected without changing the pump power levels.

Changes to the level profiles or to the gain spectrum caused by influences between a number of transmission bands have been ignored. This also can be taken into account via the controller.

Although the present invention has been described with reference to specific embodiments, those of skill in the art will recognize that changes may be made thereto without departing from the spirit and scope of the invention as set forth in the hereafter appended claims.

What is claimed is:

1. A Raman amplifier, comprising:
   a plurality of pump lasers, each pump laser arranged in a respective control loop for sensing a respectively associated pump signal of the respective control loop and maintaining, based on the sensed pump signal, a power of a respectively associated pump signal constant; and
   a wavelength division multiplexer, wherein the pump signals are combined via the wavelength division multiplexer and are fed to a transmission fiber.

2. A Raman amplifier as claimed in claim 1, wherein each control loop further comprises an optical filter connected in series with the respectively associated pump laser for frequency stabilization.

3. A Raman amplifier, comprising:
   a plurality of pump lasers, each pump laser arranged in a respective control loop for keeping a power of a respectively associated pump signal constant; and
   a wavelength division multiplexer, wherein the pump signals are combined via the wavelength division multiplexer and are fed to a transmission fiber;
   wherein each control loop includes a polarization mixer connected in series with the respectively associated pump laser.

4. A Raman amplifier, comprising:
   a plurality of pump lasers, each pump laser arranged in a respective control loop for keeping a power of a respectively associated pump signal constant; and
   a wavelength division multiplexer, wherein the pump signals are combined via the wavelength division multiplexer and are fed to a transmission fiber;
   wherein each control loop includes a measurement coupler, monitor diode and a regulator, such that the measurement coupler and the monitor diode control the power of the respectively associated pump signal, and a measurement signal controls an injection current of the respectively associated pump laser via the regulator.

5. A Raman amplifier as claimed in claim 1, wherein the Raman amplifier is operated in a linear area.

6. A Raman amplifier as claimed in claim 1, wherein power levels of the pump signals are set such that the Raman amplifier has a desired gain profile in a relevant wavelength band.

7. A Raman amplifier as claimed in claim 4, further comprising:
   a controller for providing reference variables for all of the regulators and for setting the power levels of the pump signals for an optimum gain profile based on stored or externally supplied data or signals.

8. A Raman amplifier as claimed in claim 7, wherein the controller includes an input for a busy signal, which indicates active transmission bands, and uses stored tables to activate and switch off some of the pump lasers and sets the power levels of the pump signals for an optimum gain profile.

9. A Raman amplifier as claimed in claim 7, wherein the controller controls switching of the signal levels in the event of one of failure and a changed connection state of a transmission band.

* * * * *